(12) United States Patent
Lin

(10) Patent No.: US 12,155,360 B2
(45) Date of Patent: Nov. 26, 2024

(54) PROGRAMMABLE GAIN AMPLIFIER WITH IMPEDANCE MATCHING AND REVERSE ISOLATION

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 539 days.

(21) Appl. No.: 17/674,976

(22) Filed: Feb. 18, 2022

(65) Prior Publication Data

US 2023/0268899 A1   Aug. 24, 2023

(51) Int. Cl.
*H03F 1/22* (2006.01)
*H03F 3/16* (2006.01)
*H03G 3/30* (2006.01)

(52) U.S. Cl.
CPC ............... *H03G 3/30* (2013.01); *H03F 3/16* (2013.01); *H03G 2201/103* (2013.01)

(58) Field of Classification Search
CPC ........................................................ H03F 1/22

USPC .................................................. 330/311, 278
See application file for complete search history.

(56) References Cited

U.S. PATENT DOCUMENTS

| | | | | |
|---|---|---|---|---|
| 6,888,405 B2* | 5/2005 | Cheung | ................ | H03G 1/0088 |
| | | | | 338/68 |
| 8,299,870 B2 | 10/2012 | Wu et al. | | |
| 8,829,989 B2* | 9/2014 | Guo | ..................... | H03F 3/45991 |
| | | | | 330/69 |
| 8,847,689 B2* | 9/2014 | Zhao | ....................... | H03F 3/189 |
| | | | | 330/285 |
| 8,860,597 B2* | 10/2014 | Sienko | ................ | H03M 1/0863 |
| | | | | 341/150 |

\* cited by examiner

*Primary Examiner* — Henry Choe
(74) *Attorney, Agent, or Firm* — McClure, Qualey & Rodack, LLP

(57) ABSTRACT

A programmable gain amplifier includes a programmable resistor ladder deployed across $N_{max}$ junction nodes and controlled by $N_{max}-1$ resistor control signals, where $N_{max}$ is an integer greater than one; a common-gate cascode amplifier multiplexer comprising $N_{max}$ common-gate cascode amplifiers configured to receive $N_{max}$ internal voltages at the $N_{max}$ junction nodes and output $N_{max}$ output currents in accordance with $N_{max}$ amplifier control signals, respectively, to an output node that is loaded with a load; and an AC (alternate current) coupling capacitor configured to couple an input node to the first junction node.

10 Claims, 3 Drawing Sheets

PROGRAMMABLE GAIN AMPLIFIER WITH IMPEDANCE MATCHING AND REVERSE ISOLATION

BACKGROUND OF THE DISCLOSURE

Field of the Disclosure

This present disclosure generally relates to programmable gain amplifiers and particularly to programmable gain amplifiers with impedance matching and reverse isolation.

Description of Related Art

In a communication system, a first signal is transmitted by a transmitter, propagates through a communication medium (such as free air or cable), and results in a second signal that is received by a receiver. The receiver amplifies the second signal into a third signal in accordance with a gain factor, such that the third signal has a level suitable for detection. A gain of a receiver is defined by a ratio between a level of the third signal and a level of the second signal. Since the level of the second signal may vary widely, depending on an insertion loss of the communication medium, the gain needs to be programmable, and a programmable gain amplifier is typically employed for this purpose. In many applications, impedance matching, which is fulfilled when an input impedance of the programmable gain amplifier is approximately equal to a source impedance, is required. In addition, it is desirable to have good reverse isolation so that an internal signal in the receiver cannot propagate back to communication medium.

In U.S. Pat. No. 8,299,870, Wu and Gomez disclosed a programmable gain amplifier/attenuator that can provide a wide attenuation arrange and a fine attenuation step size, wherein a plurality of switches is used to couple either an input or an attenuation of the input to an output. Said plurality of switches can allow a programmable gain, however, the circuitry of their system allows the output to directly couple back to the input, resulting in a poor reverse isolation.

What is desired is a programmable gain amplifier that can have good impedance matching and high reverse isolation.

SUMMARY OF THE DISCLOSURE

In an embodiment, a programmable gain amplifier comprises: a programmable resistor ladder deployed across $N_{max}$ junction nodes and controlled by $N_{max}-1$ resistor control signals, where $N_{max}$ is an integer greater than one; a common-gate cascode amplifier multiplexer comprising $N_{max}$ common-gate cascode amplifiers configured to receive $N_{max}$ internal voltages at the $N_{max}$ junction nodes and output $N_{max}$ output currents in accordance with $N_{max}$ amplifier control signals, respectively, to an output node that is loaded with a load; and an AC (alternate current) coupling capacitor configured to couple an input node to a first junction node of the $N_{max}$ junction nodes, wherein the programmable resistor ladder comprises $N_{max}-1$ serial resistors configured in a serial connection across the $N_{max}$ junction nodes, a shunt resistor configured to shunt the first junction node of the $N_{max}$ junction nodes to ground, and $N_{max}-1$ switch-resistor circuits configured to shunt the other $N_{max}-1$ junction nodes to ground in accordance with the $N_{max}-1$ resistor control signals, respectively.

DETAILED DESCRIPTION OF THIS DISCLOSURE

Figure 1:
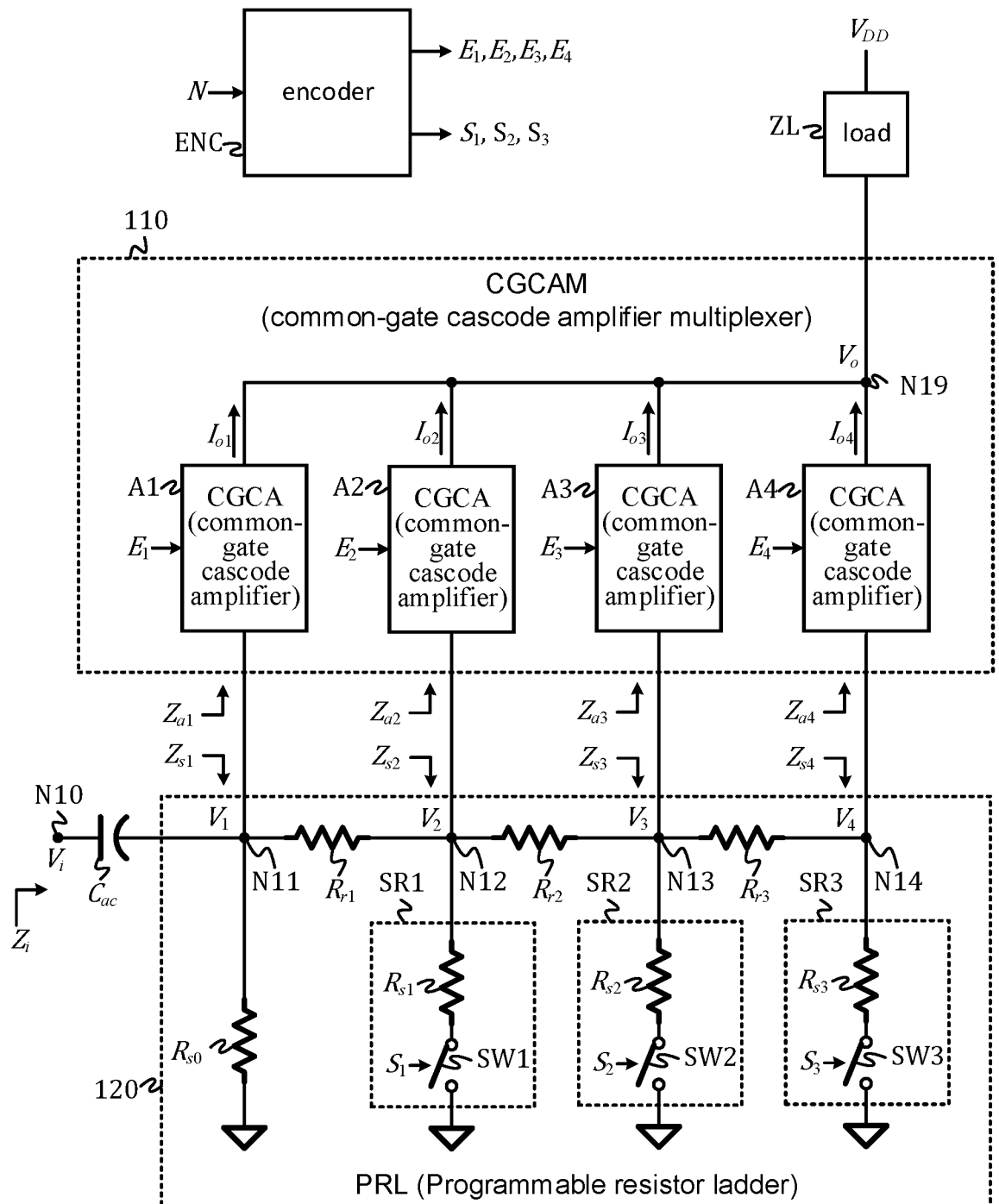
FIG. 1 shows a schematic diagram of a programmable gain amplifier in accordance with an embodiment of the present disclosure.

The present disclosure is directed to programmable gain amplifier. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "amplifier," "common-gate," "load," "shunt," "impedance," "resistance," "serial connection," "parallel connection," "multiplexer," "cascode," "switch," "resistor," "capacitor" "circuit node," "ground," "DC (direct current)," "AC (alternate current)," "power supply," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skills in the art understand units such as Ohm, pF (pico-Farad), fF (femto-Farad), nm (nanometer), μm (micro-meter), and μA (micro-Ampere) without a need of explanations.

Those of ordinary skills in the art can read schematics of a circuit comprising electronic components such as inductors, capacitors, resistors, NMOS transistors, PMOS transistors, and so on, and do not need a verbose description about how one component connects with another in the schematics. Those of ordinary skill in the art can also recognize a ground symbol, a capacitor symbol, an inductor symbol, a resistor symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A circuit is a collection of a transistor, a capacitor, a resistor, and/or other electronic devices inter-connected in a certain manner to embody a certain function.

In this disclosure, a "circuit node" is frequently simply stated as a "node" for short, when what it means is clear from a context.

A signal is a voltage of a variable level that carries a certain information and can vary with time. A level of the signal at a moment represents a state of the signal at that moment. In this present disclosure, "signal" and "voltage signal" refer to the same thing and thus are interchangeable.

A network is a circuit or a collection of circuits.

A power supply node is a circuit node of a substantially stationary voltage, and so is a ground node. Power supply node and ground node are both DC (direct current) nodes but differ in voltage level; that is, a voltage level of a power supply node is higher than a voltage level of a ground node. Following a convention widely used in the literature, in this disclosure, in a circuit, "VDD" denotes a power supply node. Although a DC level of a ground node is usually 0V, it doesn't have to be 0V. What matters is a voltage difference between the power supply node and the ground node. For a given circuit, a behavior of that circuit remains the same if a DC voltage level is raised by the same amount for all nodes.

A logical signal is a voltage signal of two states: a low state and a high state; the logical signal is in the high state when its voltage level is above a trip point and in the low state otherwise. The low state is also referred to as a "0" state, while the high stage is also referred to as a "1" state. Regarding a logical signal Q, "Q is high" or "Q is low," means that "Q is in the high state" or "Q is in the low state." Likewise, "Q is 1" or "Q is 0," means that "Q is in the 1 state" or "Q is in the 0 state."

A first logical signal may not necessarily have the same trip point as a second logical signal.

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is said to be a logical inversion of a second logical signal, the first logical signal and the second logical signal are said to be complementary to each other.

A logical signal is often used as a control signal to enable or disable a function of a circuit. When the logical signal is in a logical state that enables the function of the circuit, the logical signal is said to be "asserted"; otherwise, the logical signal is said to be "de-asserted." When a logical signal is "asserted" when it is high, it is said to be "active high"; when a logical signal is "asserted" when it is low, it is said to be "active low."

Switches are extensively used in the present disclosure. A switch is a device configured to conditionally connect a first node to a second node in accordance with a control by a logical signal; said switch is turned on and behaves like a short circuit when said logical signal is asserted; and said switch is turned off and behaves like an open circuit when said logical control signal is de-asserted.

A NMOS transistor can function as an amplifier when it is biased in a saturation region where a gate-to-source voltage is higher than a threshold voltage, but a gate-to-drain voltage is lower than the threshold voltage. The amplifier is said to be a common-gate amplifier if a voltage at the gate is substantially fixed, while a voltage at the source is variable and represents an input signal, and a voltage at the drain represents an output signal that varies in response to the input signal. When a first NMOS transistor and a second NMOS transistor are stacked up and are both biased as common-gate amplifier, wherein an output signal of the first NMOS transistor is an input signal of the second NMOS transistor, the two NMOS transistors are said to form a common-gate cascode amplifier.

A NMOS transistor can function as a switch controlled by a control signal if it is in a triode region when the control signal is asserted (wherein both a gate-to-source voltage and a gate-to-drain voltage are higher than a threshold voltage) and is in a cut-off region when the control signal is de-asserted (wherein both the gate-to-source voltage and the gate-to-drain voltage are lower than the threshold voltage). When a NMOS transistor is used to embody a switch, it is an "active high" embodiment, since the NMOS transistor is turned on when the control signal is asserted when it is high.

A schematic diagram of a PGA (programmable gain amplifier) 100 in accordance with an embodiment of the present disclosure is shown in FIG. 1. PGA 100 comprises: a PRL (programmable resistor ladder) 120 distributed over $N_{max}$ junction nodes and controlled by $N_{max}-1$ resistor control signals, wherein $N_{max}$ is an integer greater than one and by way of example but not limitation $N_{max}=4$ in this particular embodiment, the $N_{max}$ junction nodes includes a first junction node N11 and the other $N_{max}-1$ junction nodes N12, N13, and N14, and the $N_{max}-1$ resistor control signals includes resistor control signals $S_1$, $S_2$, and $S_3$; an AC (alternate current) coupling capacitor $C_{ac}$ configured to couple an input node N10 to the first junction node N11; a CGCAM (common-gate cascode amplifier multiplexer) 110 comprising $N_{max}$ CGCAs (common-gate cascode amplifiers) A1, A2, A3, and A4, controlled by $N_{max}$ amplifier control signals $E_1$, $E_2$, $E_3$, and $E_4$, and configured to receive $N_{max}$ internal voltages $V_1$, $V_2$, $V_3$, and $V_4$, at the $N_{max}$ junction nodes N11, N12, N13, and N14, and outputs $N_{max}$ output currents $I_{o1}$, $I_{o2}$, $I_{o3}$, and $I_{o4}$, respectively, to an output node N19 loaded with a load ZL; an encoder ENC configured to encode an integer N into the $N_{max}-1$ resistor control signals $S_1$, $S_2$, and $S_3$, and the $N_{max}$ amplifier control signals $E_1$, $E_2$, $E_3$, and $E_4$. Throughout this disclosure, "$V_{DD}$" denotes a power supply node. The integer N controls a gain setting of PGA 100. The PRL 120 comprises: $N_{max}-1$ serial resistors $R_{r1}$, $R_{r2}$, and $R_{r3}$, configured to provide a serial connection across the $N_{max}$ junction nodes N11, N12, N13, and N14; a shunt resistor $R_{s0}$ configured to shunt the first junction node N11 to ground; and $N_{max}-1$ switch-resistor circuits SR1, SR2, and SR3, configured to shunt the other $N_{max}-1$ junction nodes N12, N13, and N14, to ground in accordance with the $N_{max}-1$ resistor control signals $S_1$, $S_2$, and $S_3$, respectively. Switch-resistor circuit SR1 (SR2, SR3) comprises a serial connection of resistor $R_{s1}$ ($R_{s2}$, $R_{s3}$) and a switch SW1 (SW2, SW3) controlled by $S_1$ ($S_2$, $S_3$). An input impedance of CGCA A1 (A2, A3, A4) looking from junction node N11 (N12, N13, N14) is denoted by $Z_{a1}$ ($Z_{a2}$, $Z_{a3}$, $Z_{a4}$). A source impedance looking from CGCA A1 (A2, A3, A4) into junction node N11 (N12, N13, N14) is denoted by $Z_{s1}$ ($Z_{s2}$, $Z_{s3}$, $Z_{s4}$). An input impedance looking into the input node N10 is denoted by Z.

A value of the integer N is between 1 and $N_{max}$, inclusively and determines a gain of PGA 100. As explained earlier, $N_{max}$ is equal to 4 for PGA 100. However, this is just an example but not limitation, and those skill in the art can easily apply the principle to any value of $N_{max}$ that is greater than one.

A first objective of PGA 100 is to provide a gain, which is defined by a ratio between an output voltage $V_o$ at the output node N19 to an input voltage $V_i$ at the input node N10, that can be accurately programmed by setting the value of the integer N. This is fulfilled by solely selecting one CGCA in the CGCAM 110 to be turned on (while the rest of CGCAs are turned off) and properly configuring a length of PRL 120 in accordance with the value of the integer N. The length of PRL 120 determines an attenuation factor of the internal voltage received by the solely selected CGCA. This way, the gain is programmable.

A second objective of PGA 100 is to provide an impedance matching so that $Z_i$ is approximately equal to $Z_0$, which is a reference value of impedance matching, regardless of the value of the integer N. This is fulfilled by properly choosing an input impedance of the solely turned on CGCA and resistance values of the PRL 120.

A third objective of PGA 100 is to provide a high reverse isolation, so that a disturbance at the output node N19 has very little impact on the input node N10; that is, a kickback from the output voltage $V_o$ to the input voltage $V_i$ is very small. This is fulfilled due to using CGCAs A1, A2, A3, and A4, which thanks to the common-gate cascode amplifier circuit topology can inherently have a high reverse isolation.

A fourth objective of PGA 100 is to allow using the same amplifier circuit and the same common bias generation circuit for all CGCAs A1, A2, A3, and A4, regardless of the value of the integer N.

In an embodiment, an impedance of the AC coupling capacitor $C_{ac}$ is substantially smaller than the reference value of impedance matching and thus negligible.

When the resistor control signal $S_1$ ($S_2$, $S_3$) is 1, i.e., asserted, SW1 (SW2, SW3) is turned on, and a resistance value of SR1 (SR2, SR3) is approximately equal to $R_{s1}$ ($R_{s2}$, $R_{s3}$); otherwise, SW1 (SW2, SW3) is turned off, and SR1 (SR2, SR3) behaves like an open circuit.

When the amplifier control signal $E_1$ ($E_2$, $E_3$, is 1, i.e., asserted, CGCA A1 (A2, A3, A4) is turned on and $Z_{a1}$ ($Z_{a2}$, $Z_{a3}$, $Z_{a4}$) is approximately equal to an on-impedance $Z_a$; otherwise, CGCA A1 (A2, A3, A4) is turned off and behaves like an open circuit.

In an embodiment, the amplifier control signals $E_1$, $E_2$, $E_3$, and $E_4$, are encoded in accordance with a multiplexing scheme so that only one of them can be asserted at any moment and a different value of N leads to a different amplifier control signal being asserted, and the multiplexing scheme can be described by the following equation:

$$E_i = \begin{cases} 1 & \text{if } i = N \\ 0 & \text{otherwise} \end{cases} \quad (1)$$

for i=1, 2, 3, . . . , $N_{max}$. That is: when N is 1 (2, 3, 4), $E_1$ ($E_2$, $E_3$, $E_4$) is 1 and CGCA A1 (A2, A3, A4) is turned on.

The resistor control signals $S_1$, $S_2$, and $S_3$, are encoded in accordance with a thermometer-code scheme so that a total number of resistor control signals being asserted is equal to N−1, and the thermometer-code scheme can be described by the following equation:

$$S_i = \begin{cases} 0 & \text{if } i < N \\ 1 & \text{otherwise} \end{cases} \quad (2)$$

for i=1, 2, 3, . . . , $N_{max}$−1. That is, when N is 1, all switch-resistors (SR1, SR2, SR3, and so on) are all turned off; when N is 2, SR1 is turned on, while the rest (i.e., SR2, SR3) are turned off; when N is 3, SR1 and SR2 are turned on, while the rest (i.e., SR3) is turned off; when N is 4, SR1, SR2, and SR3 are all turned on.

In an embodiment, $R_{s0}$ is equal to $3Z_0/2$; $R_{r1}$, $R_{r2}$, and $R_{r3}$, are all equal to $3Z_0/2$; $R_{s1}$, $R_{s2}$, and $R_{s3}$, are all equal to $3Z_0$; and $Z_a$ is equal to $3Z_0$.

When N is 1, A1 is the only CGCA that is turned on and none of the switch resistor circuits (SR1, SR2, SR3) is turned on, and the source impedance $Z_{s1}$ that CGCA A1 sees is equal to $R_{s0}$, which is $3Z_0/2$. The input impedance $Z_i$ is equal to $R_{s0}\|Z_{a1}$, which is $Z_0$. Here, "$\|$" denotes a parallel connection. As well understood by those of ordinary skill in the art, a parallel connection of a first impedance with a second impedance results in an effective impedance equal to a product of the first impedance and the second impedance divided by a sum of the first impedance and the second impedance, i.e., $Z_1\|Z_2=Z_1Z_2/(Z_1+Z_2)$, where $Z_1$ is the first impedance and $Z_2$ is the second impedance.

When N is 2, A2 is the only CGCA that is turned on, SR1 is the only switch-resistor circuit that is turned on, and the source impedance $Z_{s2}$ that CGCA A2 sees is equal to a $R_{s1}\|(R_{r1}+R_{s0})$, which is $3Z_0/2$. The input impedance $Z_i$ is equal to $R_{s0}\|(R_{r1}+(R_{s1}\|Z_{a2}))$, which is $Z_0$. Besides, $R_{r1}$, $R_{s1}$, and $Z_{a2}$ form a voltage divider so that a ratio between $V_2$ and $V_1$ is equal to $(R_{s1}\|Z_{a2})/(R_{r1}+(R_{s1}\|Z_{a2}))$, which is ½. Therefore, CGCA A2 receives only a half of input voltage of what CGCA A1 receives in the previous case when N is 1. In other words, an attenuation factor of ½ is fulfilled when N changes from 1 to 2.

When N is 3, A3 is the only CGCA that is turned on, SR1 and SR2 are turned on while SR3 is turned off, and the source impedance $Z_{s3}$ that CGCA A3 sees is equal to a $R_{s2}\|(R_{r2}+(R_{s1}\|(R_{r1}+R_{s0})))$, which is $3Z_0/2$. The input impedance $Z_i$ is equal to $R_{s0}\|(R_{r1}+(R_{s1}\|(R_{r2}+(R_{s2}\|Z_{a3}))))$, which is $Z_0$. Besides, $R_{r2}$, $R_{s2}$, $Z_{a3}$ form a voltage divider so that a ratio between $V_3$ and $V_2$ is equal to $(R_{s2}\|Z_{a3})/(R_{r2}+(R_{s2}\|Z_{a3}))$, which is ½. Therefore, A3 receives only a half of input voltage of what A2 receives in the previous case when N is 2. In other words, an attenuation factor of ½ is fulfilled when N changes from 2 to 3.

When N is 4, A4 is the only CGCA that is turned on, SR1, SR2, SR3 are all turned on, and the source impedance $Z_{s4}$ that CGCA A4 sees is equal to a $R_{s3}\|(R_{r3}$ ($R_{s2}\|(R_{r2}+(R_{s1}\|(R_{r1}+R_{s0})))$, which is $3Z_0/2$. The input impedance $Z_i$ is equal to $R_{s0}\|(R_{r1}+(R_{s1}\|(R_{r2}+(R_{s2}\|(R_{r3}$ ($R_{s3}\|Z_{a4})))))$, which is $Z_0$. Besides, $R_{r3}$, $R_{s3}$, and $Z_{a4}$ form a voltage divider so that a ratio between $V_4$ and $V_3$ is equal to $(R_{s3}\|Z_{a4})/(R_{r3}+(R_{s3}\|Z_{a4}))$, which is ½. Therefore, A4 receives only a half of input voltage of what A3 receives in the previous case when N is 3. In other words, an attenuation factor of ½ is fulfilled when N changes from 3 to 4.

In summary, regardless of the value of N: first, the input impedance $Z_i$ is always equal to $Z_0$, and the objective of impedance matching is thus fulfilled; second, when the value of N increases by one, and additional attenuation factor of ½ of input voltage is received by the CGCA that is turned on, and the objective of accurate programmable gain is fulfilled; and third, the CGCA that is turned on will see the same impedance of $3Z_0/2$ looking into PRL 120, therefore, the objective of using the same common bias generation circuit can be fulfilled.

Figure 2:
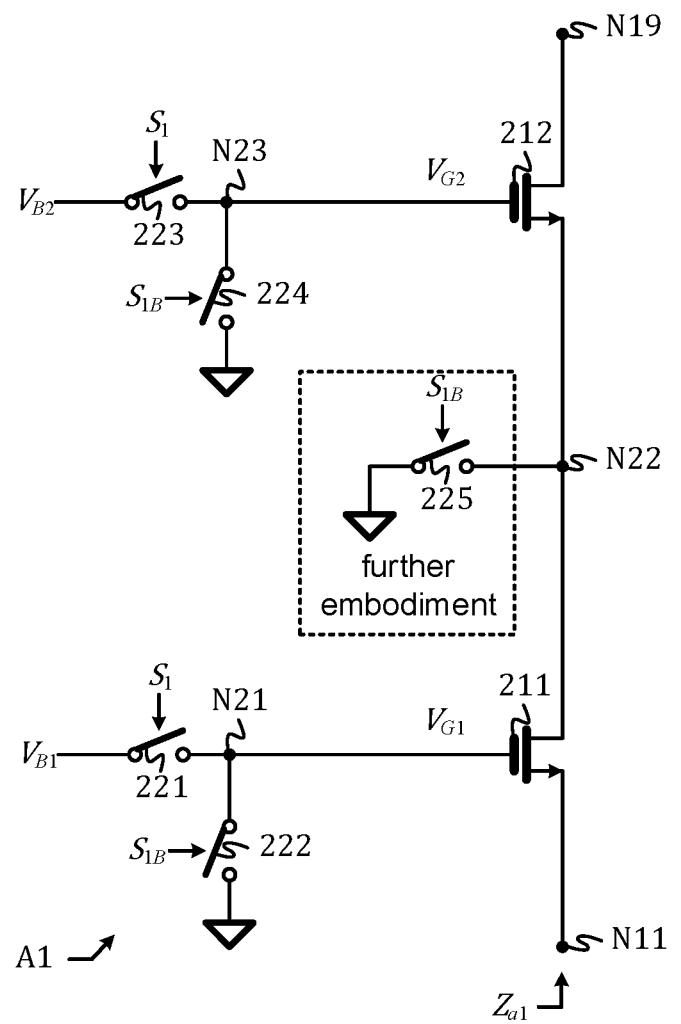
FIG. 2 shows a schematic diagram of an embodiment of a common-gate cascode amplifier for the programmable gain amplifier of FIG. 1.

A schematic diagram of an embodiment of CGCA A1 is shown in FIG. 2. CGCA A1 comprises: two NMOS transistors 211 and 212; and four switches 221, 222, 223, and 224, controlled by $S_1$, $S_{1B}$, $S_1$, and $S_{1B}$, respectively. Here, $S_{1B}$ denotes a logical inversion of $S_1$. The source, gate, and drain of NMOS transistor 211 connect to nodes N11, N21, and N22, respectively. The source, gate, and drain of NMOS transistor 212 connect to nodes N22, N23, and N19, respectively. Node N21 connects to a first bias voltage $V_{B1}$ via switch 221 and connects to ground via switch 222 so that a first gate voltage $V_{G1}$ at node N21 is equal to $V_{B1}$ when $S_1$ is asserted and tied to ground otherwise. Node N23 connects to a second bias voltage $V_{B2}$ via switch 223 and to ground via switch 224 so that a second gate voltage $V_{G2}$ at node N23 is equal to $V_{B2}$ when $S_1$ is asserted and tied to ground otherwise. When $S_1$ is de-asserted, NMOS transistors 211 and 212 are both turned off, due to that nodes N21 and N23 are tied to ground. When $S_1$ is asserted, NMOS transistors 211 and 212 are turned on and the input impedance $Z_{a1}$ is determined in accordance with $V_{B1}$ and $V_{B2}$. NMOS transistors 211 and 212 are configured in a cascode topology to provide a high reverse isolation, as node N11 is shielded by the two NMOS transistors 211 and 212 to effectively resist a kickback from node N19. In a further embodiment, A1 further comprises an additional switch 225 controlled by $S_{1B}$ and configured to tie node N22 to ground when $S_{1B}$ is asserted, or in other words, $S_1$ is de-asserted. By tying N22 to ground when $S_1$ is de-asserted, a reverse isolation is further enhanced.

The same circuit of A1 can be instantiated to embody (A2, A3, A4) by replacing node N11 with node N12 (N13, N14), replacing $S_1$ with $S_2$ ($S_3$, $S_4$), and replacing SIB with a logical inversion of $S_2$ ($S_3$, $S_4$).

Figure 3:
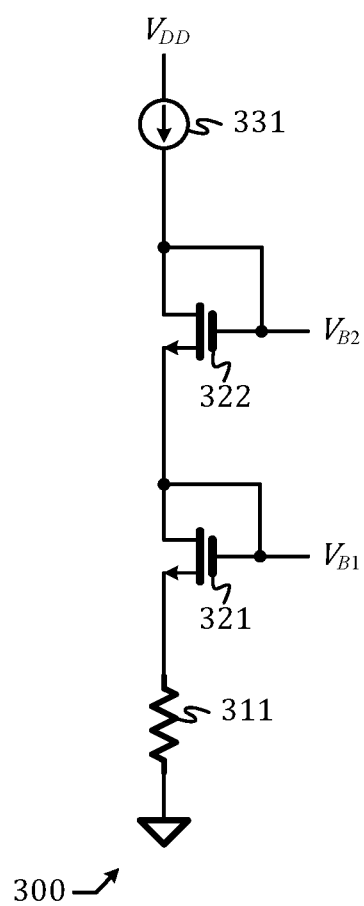
FIG. 3 shows a schematic diagram of a bias generation circuit suitable for use by the common-gate cascode amplifier of FIG. 2.

A schematic diagram of a bias generation circuit 300 that can be used to generate the two bias voltages $V_{B1}$ and $V_{B2}$ in accordance with an embodiment is shown in FIG. 3. The bias generation circuit 300 comprises a source resistor 311, a first diode-connected NMOS transistor 321, a second diode-connected NMOS transistor 322, and a current source 331. Bias generation circuit 300 is widely used in the prior art and well understood by those of ordinary skill in the art and thus no further explanation is needed here. A NMOS transistor is said to be "diode-connected" when a gate and a drain of the NMOS transistor are tied together.

In an embodiment, the load ZL is a resistor. In another embodiment, the load ZL is a resonant tank comprising a parallel connection of an inductor with a capacitor.

By way of example but not limitation: PGA 100 is fabricated on a silicon substrate using a 55 nm CMOS process technology; $Z_0$ is 50-Ohm; $V_{DD}$ is 1.5V; the load ZL is a parallel connection of a 1 nH inductor with a 500 fF capacitor; W/L (which stands for width/length) is 80 μm/60 nm for NMOS transistors 211 and 212; an output current of current source 331 is 200 μA; resistor 311 is 750-Ohm; W/L is 8 μm/60 nm for NMOS transistors 321 and 322; and $C_{ac}$ is 2 pF.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A PGA (programmable gain amplifier) comprising:
a programmable resistor ladder deployed across $N_{max}$ junction nodes and controlled by $N_{max}$-1 resistor control signals, where $N_{max}$ is an integer greater than one;
a common-gate cascode amplifier multiplexer comprising $N_{max}$ CGCAs (common-gate cascode amplifiers) configured to receive $N_{max}$ internal voltages at the $N_{max}$ junction nodes and output $N_{max}$ output currents in accordance with $N_{max}$ amplifier control signals, respectively, to an output node that is loaded with a load; and
an AC (alternate current) coupling capacitor configured to couple an input node to a first junction node of the $N_{max}$ junction nodes, wherein the programmable resistor ladder comprises $N_{max}$-1 serial resistors configured in a serial connection across the $N_{max}$ junction nodes, a shunt resistor configured to shunt the first junction node of the $N_{max}$ junction nodes to ground, and $N_{max}$-1 switch-resistor circuits configured to shunt the other $N_{max}$-1 junction nodes to ground in accordance with the $N_{max}$-1 resistor control signals, respectively.

2. The PGA of claim 1, further comprising an encoder configured to receive an integer N and output the $N_{max}$-1 resistor control signals and the $N_{max}$ amplifier control signals, wherein N is an integer between one and $N_{max}$, inclusively.

3. The PGA of claim 2, wherein the $N_{max}$ amplifier control signals are encoded by the encoder in a multiplexing scheme so that only one of the $N_{max}$ amplifier control signals can be asserted at any moment, and a different value of N leads to a different amplifier control signal being asserted.

4. The PGA of claim 3, wherein the -1 resistor control signals are encoded by the encoder in a thermometer-code scheme so that a total number of resistor control signals being asserted is equal to N-1.

5. The PGA of claim 4, wherein the shunt resistor and the $N_{max}$-1 serial resistors have the same impedance of $3Z_0/2$, wherein $Z_0$ is a reference value of impedance matching.

6. The PGA of claim 5, wherein each of the $N_{max}$-1 switch-resistor circuits is controlled by a respective resistor control signal, is turned on and exhibits a resistance value equal to $3Z_0$ when the respective resistor control signal is asserted, and is turned off and behaves like an open circuit when the respective resistor control signal is de-asserted.

7. The PGA of claim 6, wherein each of the $N_{max}$ CGCAs is controlled by a respective amplifier control signal, is turned on and exhibits an input impedance equal to $3Z_0$ when the respective amplifier control signal is asserted, and is turned off and behaves like an open circuit when the respective amplifier control signal is de-asserted.

8. The PGA of claim 1, further comprising a bias generation circuit configured to generate a first bias voltage and a second bias voltage that can be used to bias the CGCAs.

9. The PGA of claim 8, wherein each of the $N_{max}$ CGCA is controlled by a respective amplifier control signal and comprises a first NMOS (n-channel metal oxide semiconductor) transistor and a second NMOS transistor configured in a stack-up topology, a gate of the first NMOS transistor and a gate of the second NMOS transistor are connected to the first bias voltage and the second bias voltage, respectively, when the respective amplifier control signal is asserted, and the gate of the first NMOS transistor and the gate of the second NMOS transistor are tied to ground when the respective amplifier control signal is de-asserted.

10. The PGA of claim 9, wherein an inter-connection node between the first NMOS transistor and the second NMOS transistor is tied to ground when the respective amplifier control signal is de-asserted.

* * * * *